United States Patent
Hattori et al.

(10) Patent No.: US 10,366,750 B2
(45) Date of Patent: Jul. 30, 2019

(54) NONVOLATILE MEMORY DEVICE

(71) Applicant: Winbond Electronics Corp., Taichung (TW)

(72) Inventors: Norio Hattori, Kanagawa (JP); Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/861,701

(22) Filed: Jan. 4, 2018

(65) Prior Publication Data

US 2018/0261285 A1    Sep. 13, 2018

(30) Foreign Application Priority Data

Mar. 9, 2017 (JP) .................................. 2017-044471

(51) Int. Cl.
*G11C 13/00* (2006.01)
*H01L 27/24* (2006.01)
*G11C 8/08* (2006.01)

(52) U.S. Cl.
CPC ........ *G11C 13/004* (2013.01); *G11C 13/0023* (2013.01); *G11C 13/0028* (2013.01); *G11C 13/0033* (2013.01); *G11C 13/0035* (2013.01); *G11C 13/0069* (2013.01); *G11C 13/0097* (2013.01); *H01L 27/24* (2013.01); *G11C 8/08* (2013.01); *G11C 2013/0047* (2013.01); *H01L 2924/1438* (2013.01)

(58) Field of Classification Search
None
See application file for complete search history.

(56) References Cited

U.S. PATENT DOCUMENTS

| | | | |
|---|---|---|---|
| 6,584,552 B1 * | 6/2003 | Kuno ..................... | G06F 21/10 386/E5.004 |
| 9,947,387 B2 * | 4/2018 | Louie .................... | G11C 11/417 |
| 2009/0168494 A1 * | 7/2009 | Lee ...................... | G11C 13/0004 365/148 |
| 2009/0237979 A1 * | 9/2009 | Mukai .................... | G11C 7/18 365/148 |

(Continued)

FOREIGN PATENT DOCUMENTS

| | | |
|---|---|---|
| CN | 102012867 | 4/2011 |
| JP | 2008041704 | 2/2008 |

(Continued)

*Primary Examiner* — Douglas King
(74) *Attorney, Agent, or Firm* — JCIPRNET (57) ABSTRACT

A semiconductor memory device for suppressing a decrease of durability caused by erasure of a block unit or programming of a word unit is provided. A resistance change memory 100 includes a memory array 110 and a controller 120. The memory array 110 stores data by a reversible and nonvolatile variable resistance element. When erasing a selected block of the memory array 110 in response to an external erasure command, the controller 120 sets an EF flag indicating the selected block is in an erasure state without changing block data. The controller 120 further includes a reading unit. The reading unit outputs data of a selected word or data indicating the erasure based on the EF flag when reading the selected word of the memory array 110 in response to an external reading command.

6 Claims, 12 Drawing Sheets

(56) References Cited

U.S. PATENT DOCUMENTS

| | | | | |
|---|---|---|---|---|
| 2009/0244976 A1* | 10/2009 | Kajimoto | ............ | G11C 11/5628 |
| | | | | 365/185.11 |
| 2015/0016207 A1* | 1/2015 | Louie | .................... | G11C 5/148 |
| | | | | 365/229 |
| 2015/0227459 A1 | 8/2015 | Adachi et al. | | |

FOREIGN PATENT DOCUMENTS

| | | |
|---|---|---|
| JP | 2009230796 | 10/2009 |
| JP | 2012064286 | 3/2012 |
| JP | 2013168204 | 8/2013 |
| TW | I539461 | 6/2016 |

* cited by examiner

word [n, m] = 00000002h
word [n, m] = FFFFFFFFh

FIG. 6(B)

word [n, m]

DIN = FFFFFFFEh
word [n, m] = 00000002h
erase all words in BLK [n]
word [n, m] = 00000001h

FIG. 11(A) erasure word [n, m]=00000002h
word [n, m]=00000002h
EF[n, *]=1

FIG. 11(B) programming

DIN=FFFFFFEh
word [n, m]=00000002h
word [n, m]=FFFFFFEh
EF[n, m]=0

FIG. 11(C) example 1 of the reading action word [n, m]=00000002h
EF[n, m]=1
DOUT=FFFFFFFFh FIG. 11(D) example 2 of the reading action word [n, m]=00000002h
EF[n, m]=0
DOUT=00000002h

erasure

FIG. 16(B)

Example 1 of the programming action

FIG. 16(C)

Example 2 of the programming action

FIG. 17(A)

word [n, m] = 00000002h
EF[n, m] = 1, RF[n, m] = 1
DOUT = FFFFFFFFh

Example 1 of the reading action

FIG. 17(B)

word [n, m] = FFFFFFFEh
EF[n] = 0, RF[n, m] = 1
DOUT = FFFFFFFEh

Example 2 of the reading action

FIG. 17(C)

word [n, m] = 00000001h
EF[n, m] = 0, RF[n, m] = 0
DOUT = FFFFFFFEh

Example 3 of the reading action

NONVOLATILE MEMORY DEVICE

CROSS-REFERENCE TO RELATED APPLICATION

This application claims the priority benefit of Japan application serial no. 2017-044471, filed on Mar. 9, 2017. The entirety of the above-mentioned patent application is hereby incorporated by reference herein and made a part of this specification.

BACKGROUND OF THE INVENTION

Field of the Invention

The invention relates to a semiconductor memory device and particularly relates to a resistance change memory using a variable resistance element.

Description of Related Art

The resistance change memory applying a variable resistance element and acting as a non-volatile memory to replace the flash memory has raised attention. The resistance change memory is known as a memory that applies an impulse voltage to a film of metal oxide or the like, sets a resistance of the film in a reversible and non-volatile manner, and thereby stores data. The resistance change memory can rewrite data through applying the voltage and, as a result, can consume little electricity. Besides, because the resistance change memory has a simple structure of one transistor plus one resistor, the unit area is reduced to 6 F2 (F is the diameter of the wire, which is around several dozens nm). As such, the resistance change memory can have advantages of high-density and short reading time of 10 ns, which is as short as that of a dynamic random access memory (DRAM) (Patent Literatures 1 and 2, etc.).

Figure 1:
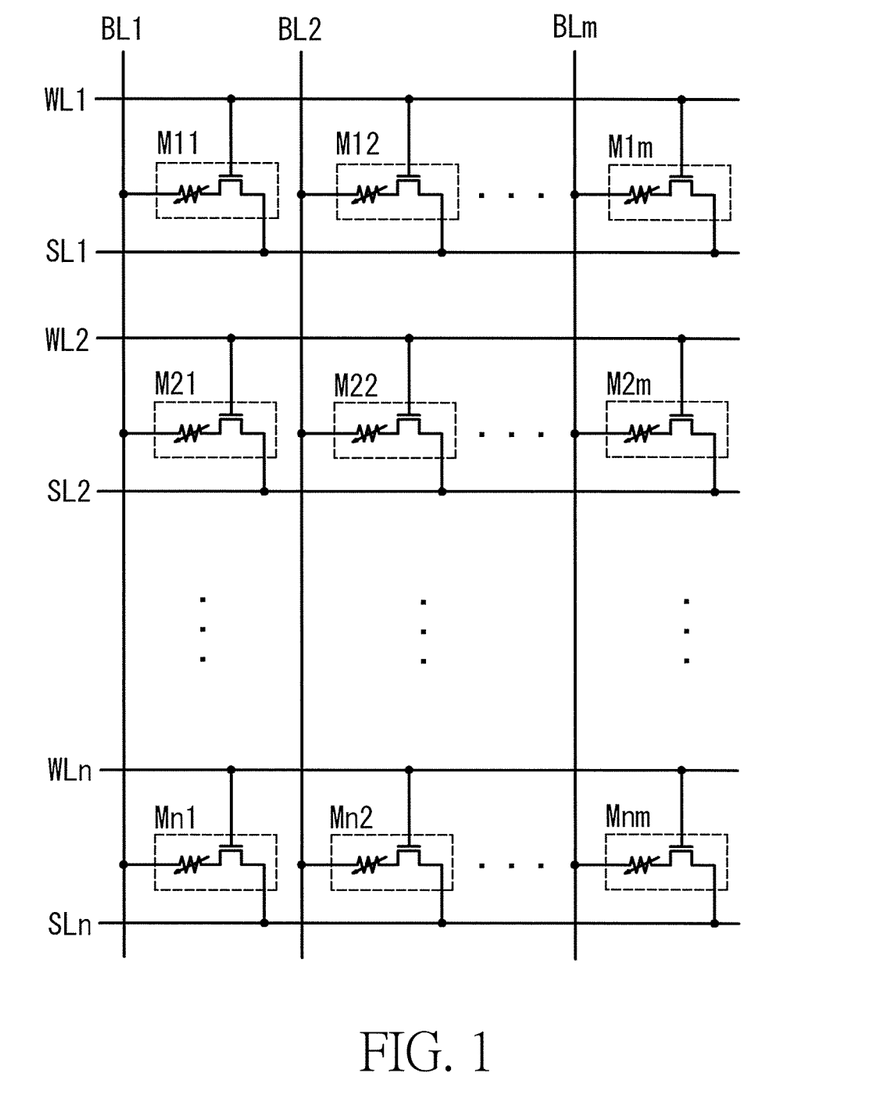
FIG. 1 is a schematic view of a typical structure of a memory array in a conventional resistance change memory.

FIG. 1 is a circuit diagram of a typical structure of a memory array in a conventional resistance change memory. A memory cell unit includes a variable resistance element and a transistor connected in series to the variable resistance element for data access, and m×n cell units (m and n are integers equal to or greater than 1) are arranged in a two-dimensional array, wherein a gate of the transistor is connected to a word line, a drain region of the transistor is connected to an electrode of the variable resistance element, a source region of the transistor is connected to a source line, and another electrode of the variable resistance element is connected to a bit line.

The variable resistance element includes a thin film of hafnium oxide (HfOx) or other metal oxides and can set the resistance of the variable resistance element in a reversible and non-volatile manner to be in a state of high resistance or low resistance according to the scale of the applied impulse voltage and the polarity of the applied impulse voltage. Setting (or writing) the variable resistance element to be in the state of high resistance is referred to as "SET", and setting (writing) the variable resistance element to be in the state of low resistance is referred to as "RESET".

The cell units can be selected in unit of a bit through the word line, the bit line, and the source line. For instance, if data are written into a cell unit M11, the transistor is switched on by a word line WL1, the voltage corresponding to SET or RESET is applied to a bit line BL1 and a source line SL1, and the variable resistance element is SET or RESET accordingly; if data are read from the cell unit M11, the transistor is switched on by the word line WL1, and the voltage for reading data is applied to the bit line BL1 and the source line SL1, wherein the bit line BL1 has the voltage or the current corresponding to SET or RESET of the variable resistance element and detects the voltage or the current by a sensor circuit.

PRIOR ART LITERATURE

Patent Literature

[Patent Literature 1] Japanese Patent Publication No. 2012-64286
[Patent Literature 2] Japanese Patent Publication No. 2008-41704

Problem to be Solved

Different from the flash memory, the resistance change memory can directly switch (rewrite) data from "0" to "1" or switch (rewrite) data from "1" to "0," whereas the flash memory sets data as "1" by performing an erasure action and sets the data as "0" by performing a programming action, and the action of programming the data from "0" to "1" does not exist. As a result, to replace the flash memory with the resistance change memory, ideally speaking, the specification of the resistance change memory should be compatible with that of the flash memory, i.e., the resistance change memory is required to perform erasure or other commands corresponding to those performed by the flash memory. Hence, if the resistance change memory asserts a block erasure command, the resistance change memory has to RESET all memory cells included in the target block (by switching the data in the target block to "1"). However, if any memory cell storing data "1" is included in the RESET memory cells, the action of RESET may not be unnecessary for the memory cell storing the data "1". Repeating unnecessary rewriting actions consumes the rewriting limit of the resistance change memory for no reason and deteriorates the durability thereof.

Figure 2:
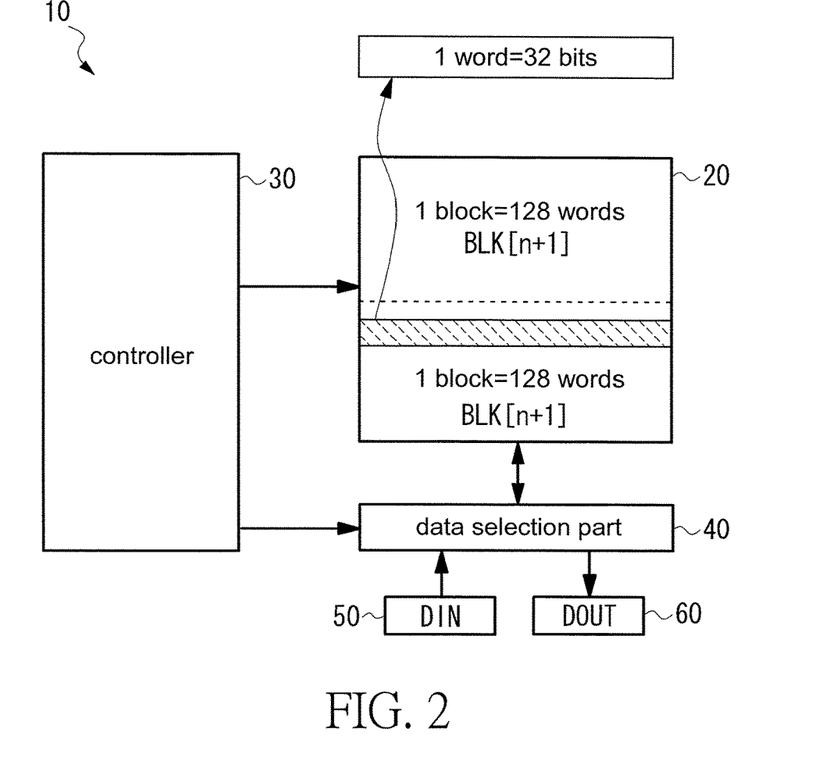
FIG. 2 is a schematic block diagram of an overall structure of a conventional resistance change memory.

FIG. 2 briefly illustrates a structure of a conventional resistance change memory. A resistance change memory 10 includes a memory array 20, a controller 30, a data selection part 40, a data input part 50, and a data output part 60. The resistance change memory 10 can, for example, perform an action compatible with a NOR flash memory, and the controller 30 can execute the block erasure command, the programming command, and the reading command corresponding to those executed by the flash memory. The controller 30 can perform an erasure action in unit of a block and can perform a programming action and a reading action in unit of a word. An example is given in the figure, i.e., the memory array 20 includes a plurality of blocks, wherein a block includes 128 words and a word includes 32 bits.

Figure 3:
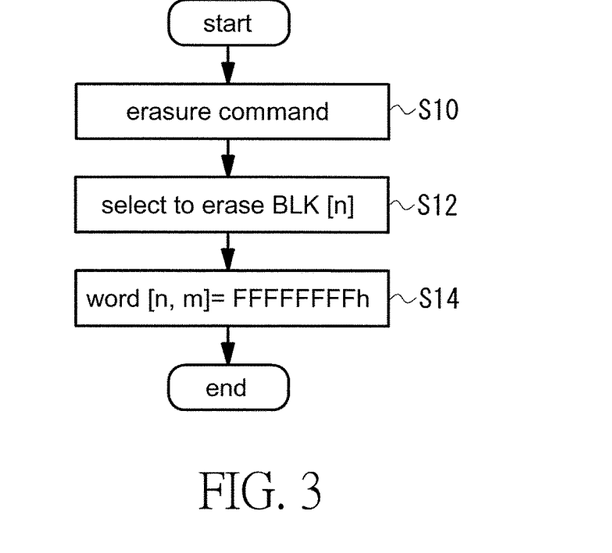
FIG. 3 is a flow chart of an erasure action of a conventional resistance change memory, wherein the erasure action is compatible with an erasure action of the flash memory.
Figure 6A:
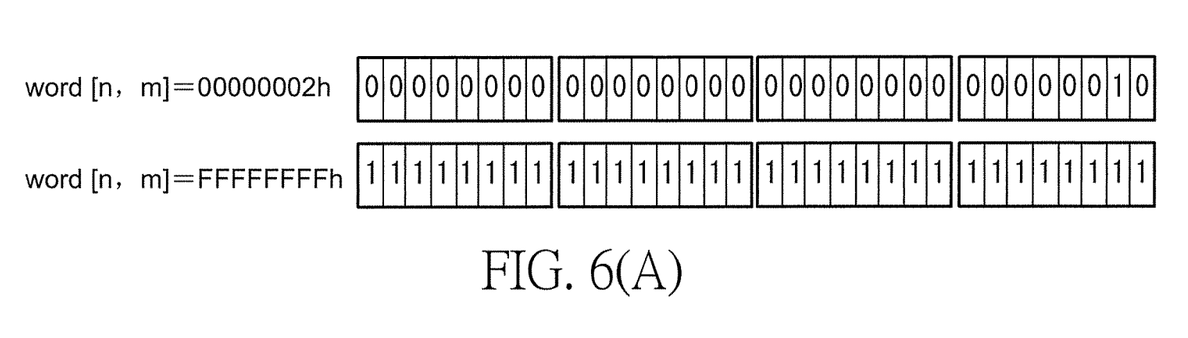
FIG. 6(A) and FIG. 6(B) are schematic views of concrete examples of an erasure action and a programming action of a conventional resistance change memory.

FIG. 3 is a flow chart illustrating an erasure action of the resistance change memory, wherein the erasure action is compatible with the erasure action performed by the NOR flash memory. After receiving an external erasure command and an address of a block which should be erased (S10), the controller 30 selects a block [n] that should be erased from the memory array 20 (S12) and RESETs all words in the selected block [n] (S14). Here, if the data "1" indicates erasure, the controller 30 writes the data "1" into all words in the selected block [n]. For instance, as shown in FIG. 6(A), if a selected word [n, m], namely the $m^{th}$ word in the selected block [n], is "00000002h," the selected word [n, m] is rewritten as "FFFFFFFFh".

Figure 4:
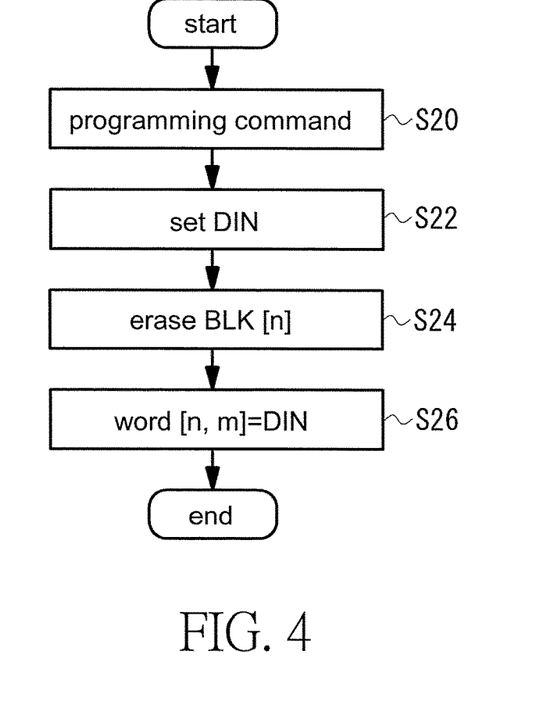
FIG. 4 is a flow chart of a programming action of a conventional resistance change memory, wherein the programming action is compatible with a programming action of the flash memory.

FIG. 4 is a flow chart illustrating a programming action. An erasure action is required before the programming action is performed. The controller 30 receives an external erasure command and an address (S20). After the controller 30 receives an external input data DIN that should be programmed and sets the input data DIN in the data input part 50 (S22), and before the programming action is performed, the block [n] including the selected word is erased (S24), i.e., all the words in the block [n] are RESET as data "1". After the erasure of the block [n] ends, the input data DIN kept by the data input part 50 is programmed to the selected word (S26).

Figure 6B:
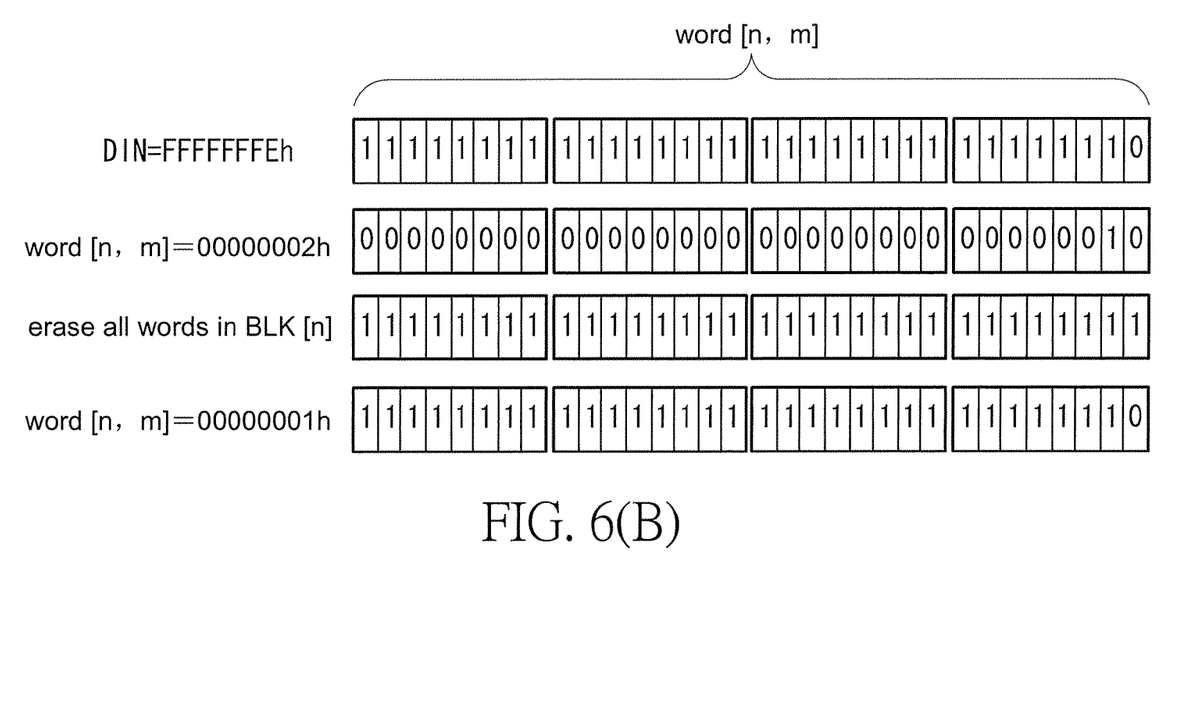

For instance, as shown in FIG. 6(B), the data DIN that should be programmed is "FFFFFFFFh," and the data stored in the selected word is "00000002h". The controller 30 completely erases the block [n] including the selected word, i.e., writes the data "1" in all the words included in the block [n], and then the controller 30 writes data "00000001h" in the selected word. The action of erasing the block is required even if the programming action is performed on one bit of data, and therefore the data "1" is rewritten in the memory cells storing the data "1" in the block [n].

Figure 5:
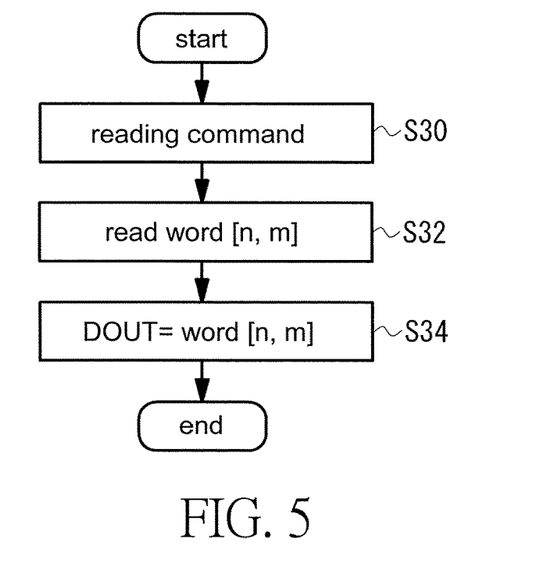
FIG. 5 is a flow chart of a reading action of a conventional resistance change memory, wherein the reading action is compatible with a reading action of the flash memory.

FIG. 5 is a flow chart illustrating a reading action. After receiving the external erasure command and the address (S30), the controller 30 reads the selected word (S32) and outputs the read data from the data output part 60.

SUMMARY OF THE INVENTION

The invention provides a semiconductor memory device as described below. The semiconductor memory device suppresses a decrease of durability accompanied by an erasure of a block unit or a programming of a word unit and solves the conventional problems.

Technical Means to Solve the Problems

A semiconductor memory device provided in the invention includes: a memory array storing data by a reversible and non-volatile variable resistance element, an erasure unit setting a first flag data indicating the selected block is in an erasure state without changing the data in the selected block when erasing a selected block of the memory array in response to an external erasure command, and a reading unit outputting data of the selected word or data indicating the erasing based on the first flag data when reading a selected word of the memory array in response to an external reading command.

When the first flag data indicates the erasure state, the data indicating the erasing is output by the reading unit without relation of data stored in the selected word. When the first flag data indicates a non-erasure state, the reading unit outputs the data stored in the selected word. The semiconductor memory device further includes a programming unit which responds to an external programming command, programs input data to the selected word of the memory array, and sets the first flag data to be in a non-erasure state. The programming unit compares the data stored in the selected word with the input data, programs the input data or reverse conversion data of the input data to the selected word according to a comparing result, and sets a second flag data for determining data for programming. The programming unit reverses inconsistent data in the selected word according to the comparing result. If a ratio of inconsistency between the input data and the data stored in the selected word is 50% or more than 50%, the input data is programmed to the selected word; if the ratio of inconsistency is less than 50%, the reverse conversion data is programmed to the selected word, and the second flag data indicates the input data or the reverse conversion data is already programmed. The reading unit further outputs the data of the selected word or the reverse conversion data of the input data based on the second flag data. The memory array includes a flag region storing the first flag data and the second flag data, the flag region is set correspondingly to each word of a memory cell. The erasure command, the programming command, and the reading command are compatible commands with a flash memory.

A semiconductor memory layer provided in the invention includes a non-volatile memory element, an erasure unit, and a reading unit. The non-volatile memory element is capable of performing a random access action and rewriting data of the memory element from "0" to "1" or from "1" to "0". When erasing a selected block of the memory element in response to an external erasure command, the erasure unit sets a first flag data indicating the selected block is in an erasure state without changing data in the selected block. When reading a selected word of the memory element in response to an external reading command, the reading unit outputs data stored in the selected word or data indicating the erasing based on the first flag data.

Effects of the Invention

According to the invention, in the semiconductor memory device capable of directly rewriting data of the non-volatile memory element from "0" to "1" or from "1" to "0," when erasing a block unit or programming a word unit, unnecessary rewriting actions can be reduced to avoid decrease in the durability of the memory element.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

DESCRIPTION OF THE EMBODIMENTS

Some embodiments of the invention are provided with reference to the drawings. However, it should be noted that the accompanying drawings may present some parts with emphasis for easy understanding and thus may not comply with the proportional scale of the actual device and elements.

Embodiments

Figure 7:
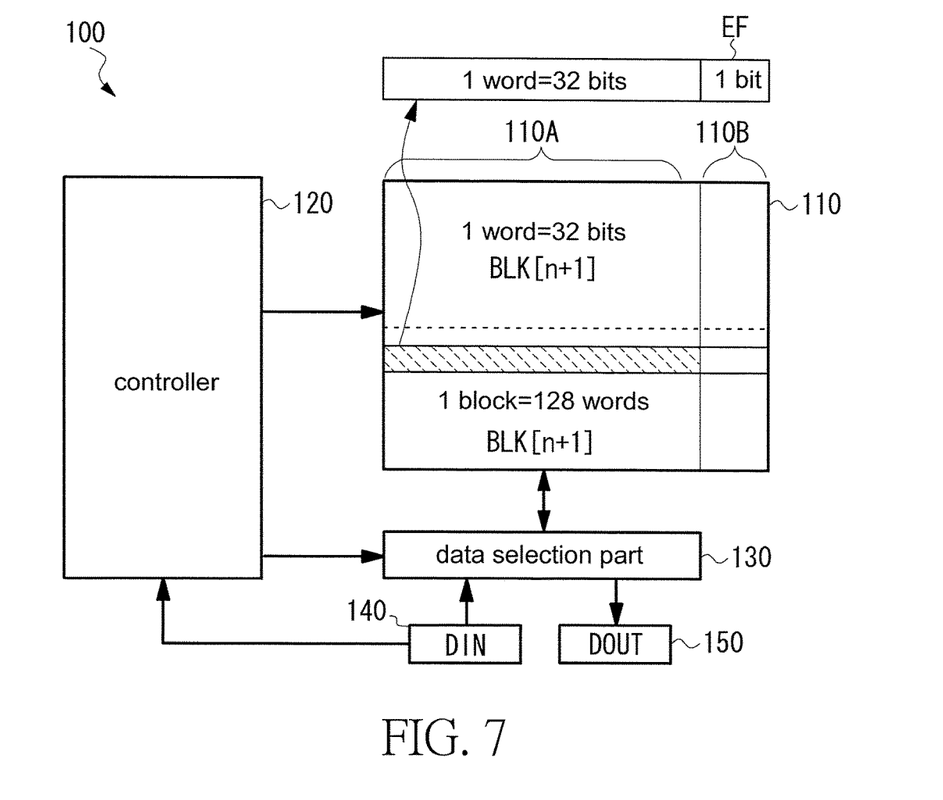
FIG. 7 is a schematic block diagram of an overall structure of a resistance change memory according to a first embodiment of the invention.

FIG. 7 is a schematic block diagram of an overall structure of a resistance change memory according to a first embodiment of the invention. A resistance change memory 100 includes a memory array 110, a controller 120, a data selection part 130, a data input part 140, and a data output part 150. The memory array 110 is equipped with a plurality of cell units (having memory cells of a variable resistance element and a transistor for data access) arranged in a matrix. The data selection part 130 selects input data or output data according to a column address. The data input part 140 keeps input data DIN obtained from an external terminal. The data output part 150 keeps output data DOUT output to the external terminal The controller 120 selects the memory cell based on an external command and address, etc. and SETs or RESETs the selected memory cell. In an embodiment, the specification of the controller 120 is compatible with that of the flash memory, i.e., the controller 120 can perform actions corresponding to commands used by the flash memory (the erasure command, the programming command, and the reading command). For instance, the resistance change memory 100 may include an external terminal receiving the command data, an external terminal receiving the address data, and an external terminal receiving the input data, and the controller 120 can execute the erasure action, the programming action, and the reading action which are compatible with the flash memory based on the command, the address, and the input data received from the external terminals. Alternatively, the resistance change memory 100 may also receive the command data, the address data, and the input data from a common external terminal; in this case, the controller 120 identifies the command data, the address data, or the data input from the external terminal according to an external control signal or a clock signal.

When executing the erasure action in a manner compatible with the flash memory, the controller 120 can manage the memory array 110 in unit of a block and execute the erasure action in unit of a block. The block is the unit of the erasure action and can be regulated to include any number of word. As shown in FIG. 7, the memory array 110 includes a main region 110A for storing data and a flag region 110B storing flag data for determining the state of the main region 110A. When executing the erasure action, the controller 120 selects from the memory array 110 a block that should be erased and erases the selected block based on the input block address. The details will be provided below. Note that the flag data set in the flag region 110B by the controller 120 indicates not to rewrite the data stored in the main region 110A in the selected block but to erase the selected block. For instance, as shown in FIG. 7, a block includes 128 words, and a word includes a main region of 32 bits and an EF flag of 1 bit. After a block [n] is selected, all the EF flags of 128 bits of the 128 words included in the block [n] are set as "1".

When executing the programming action in a manner compatible with the flash memory, the controller 120 can manage the memory array 110 in a unit of a word and execute the programming action in a unit of a word. The word is the unit for the programming/reading action and can be regulated to include any number of bit. The controller 120 selects a word from the memory array 110 and programs the input data DIN to the selected word based on the input address. When programming the selected word, the controller 120 sets the EF flag as "0" for indicating the state after executing the programming action.

In addition, when executing the reading action in a manner compatible with the flash memory, the controller 120 can manage the memory array 110 in unit of a word and execute the reading action in unit of a word. The controller 120 selects a word from the memory array 110 based on the input address and outputs data stored in the selected word or data indicating the erasing without relation of the data stored in the selected word according to the set state of the EF flag in the flag region 110B of the selected word.

Figure 8:
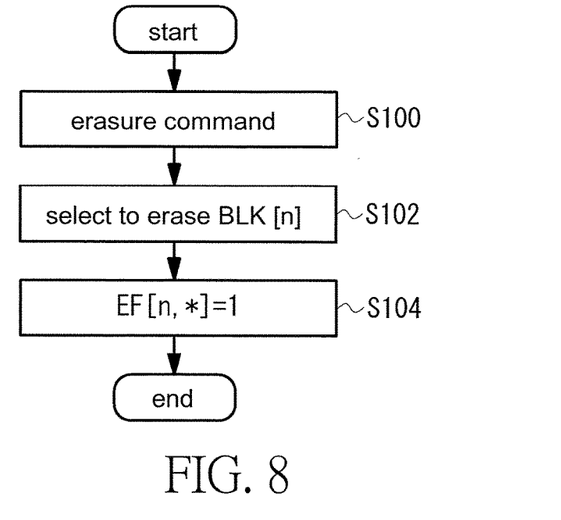
FIG. 8 is a flow chart of an erasure action of the resistance change memory according to the first embodiment of the invention.
Figure 11A:
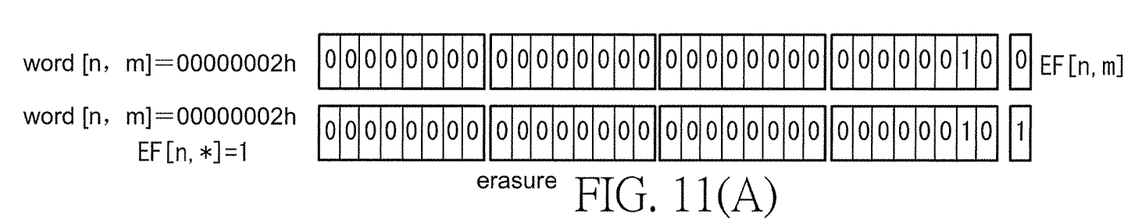
FIG. 11(A) to FIG. 11(D) are schematic views of concrete examples of the erasure action, the programming action, and the reading action of the resistance change memory according to the first embodiment of the invention.

The actions executed in the first embodiment are explained hereinafter in detail. FIG. 8 is a flow chart of the erasure action of the resistance change memory according to this embodiment. After receiving an external erasure command and an external address of a block which should be erased (S100), the controller 120 selects from the memory array 110 the block [n] that should be erased (S102). The controller 120 does not rewrite the data of the main region 110A as "1" but sets "1" as the EF flags [n, *] of all words in the selected block [n] (S104), and the erasure action ends. Here, the data "1" indicates erasure, and [*] indicates all the blocks [n]. FIG. 7 is taken for example. When the selected block [n] is erased, the EF flags of 128 bits of all of the words included in the selected block [n] are set as "1". FIG. 11(A) illustrates a concrete example. When a $m^{th}$ word [n, m] in the to-be-erased selected block [n] is "00000002h," the data is not modified at all; instead, the EF flags of the flag region 110B are set as "1," and the EF flags of the other words in the selected block [n] are set as "1" as well.

Figure 9:
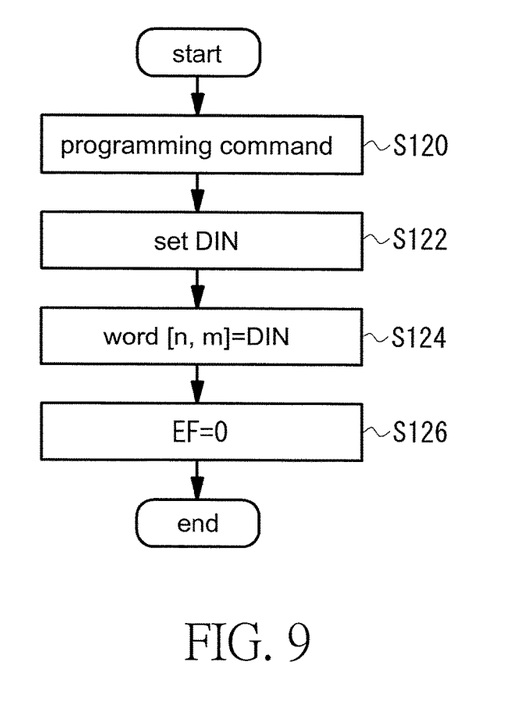
FIG. 9 is a flow chart of a programming action of the resistance change memory according to the first embodiment of the invention.
Figure 11B:
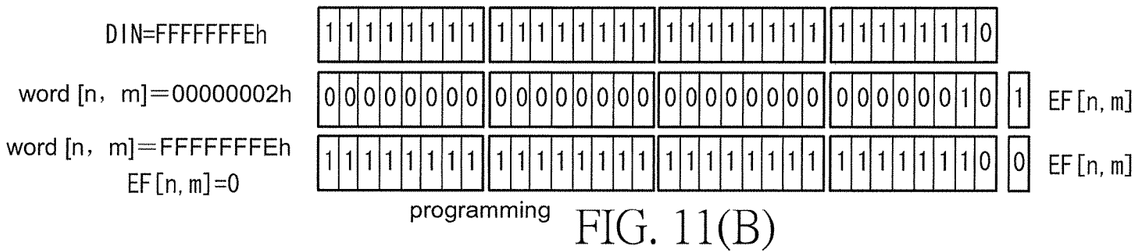

FIG. 9 is a flow chart describing the programming action according to this embodiment. The controller 120 receives the external erasure command and the address (S120) and loads a to-be-programmed external input data DIN to the data input part 50 (S122). Next, the controller 120 selects the $m^{th}$ word [n, m] in the selected block [n] from the memory array 110 according to the row address, programs the input data DIN to the main region 110A of the selected word [n, m] (S124), and sets the EF flag of the selected word [n, m] as "0" (S126). The EF flag as "0" indicates that the selected word [n, m] is not erased but is programmed. FIG. 11(B) illustrates a concrete example. When the input data DIN is "FFFFFFFEh," and the data stored in the selected word [n, m] is "00000002h," the input data DIN is programmed to the selected word [n, m], and the EF flag is set as "0".

Figure 10:
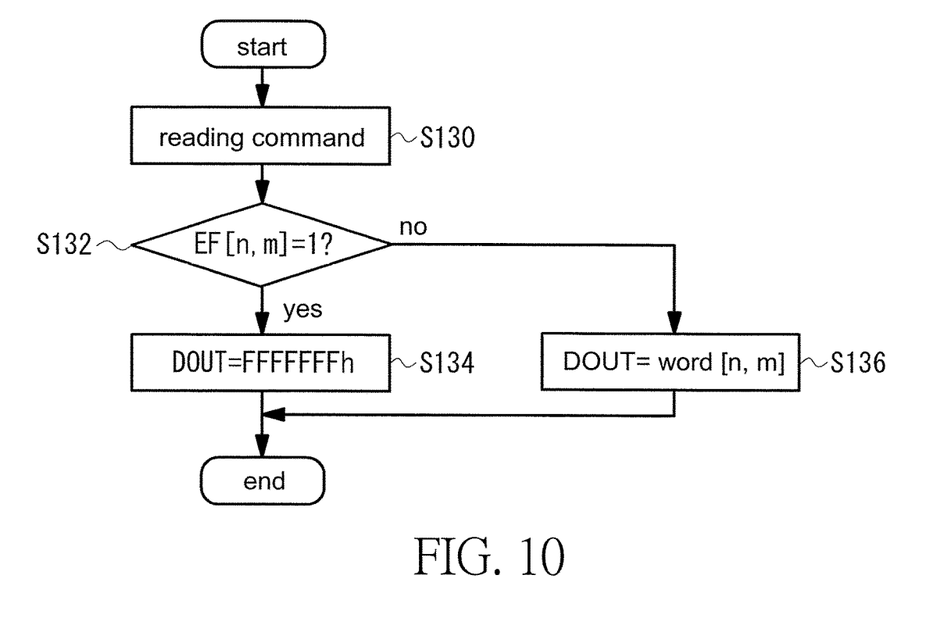
FIG. 10 is a flow chart of a reading action of the resistance change memory according to the first embodiment of the invention.
Figure 11C:
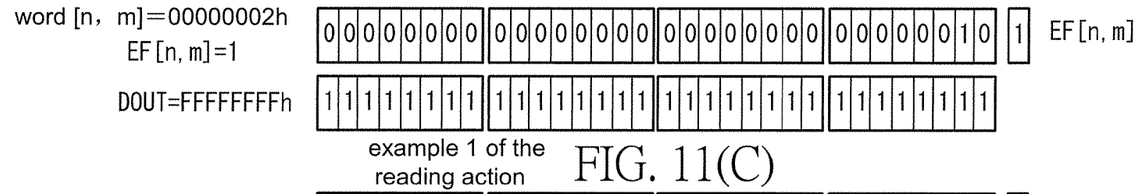
Figure 11D:
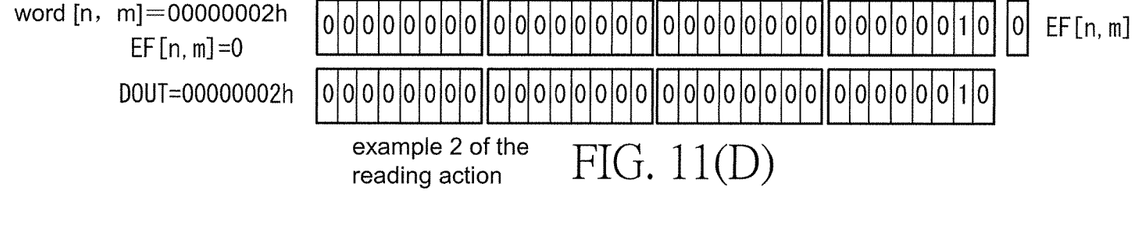

FIG. 10 is a flow chart describing the reading action according to this embodiment. After receiving an external reading command and an address (S130), the controller 120 selects the word [n, m] in the selected block [n] according to the row address and determines whether the EF flag of the selected word [n, m] is "1" or not (S132). If the EF flag is "1," the controller 120 outputs all the reading data DOUT as "1," which indicates the erasure action, regardless of the data stored in the selected word [n, m] (S134). By contrast, if the EF flag is "0," the controller 120 reads the data stored in the selected word [n, m] and outputs the data as the reading data DOUT (S136). FIG. 11(C) and FIG. 11(D) illustrate concrete examples. In Example 1 of the reading action, as illustrated in FIG. 11(C), the EF flag is "1," and thus "FFFFFFFFh" is output as the reading data DOUT. In Example 2 of the reading action, as illustrated in FIG. 11(D), the EF flag is "0," and therefore the data stored in the selected word [n, m], which is "00000002h," is output as the reading data DOUT.

In light of the above, according to this embodiment, when erasing the selected block from the memory array 110, the words in the selected block are not all rewritten as data "1". As a result, the data "1" is not required to be written again (RESET) to the variable resistance element storing the data "1", and the decrease in durability of the variable resistance element can be avoided.

Figure 12:
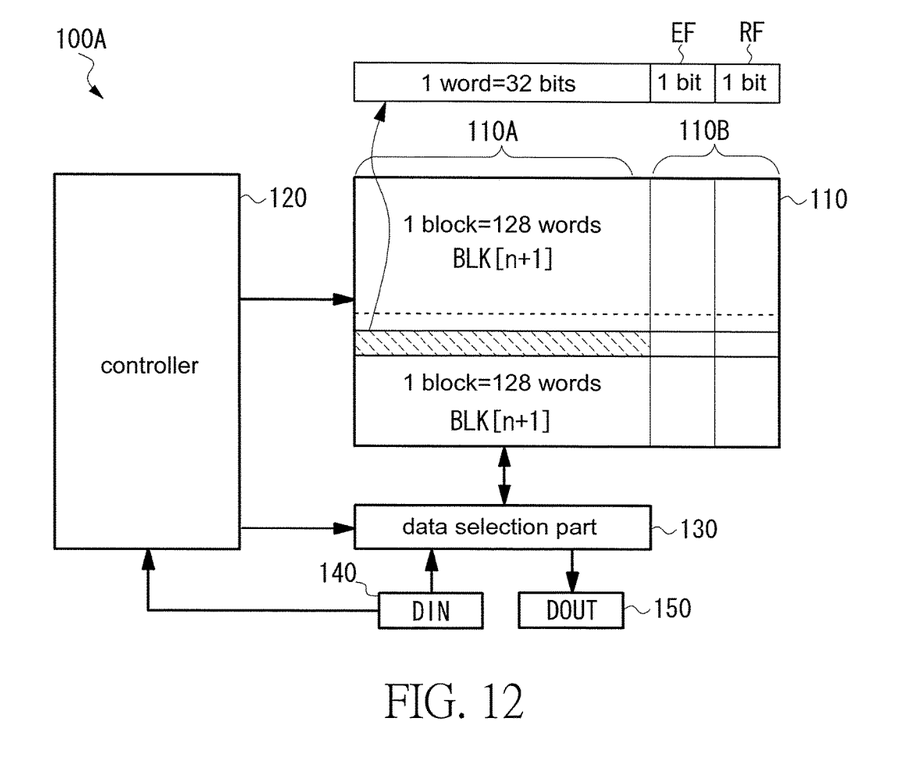
FIG. 12 is a schematic view of an overall structure of a resistance change memory according to a second embodiment of the invention.

The second embodiment of the invention is explained below. FIG. 12 is a schematic view of the structure of a resistance change memory 100A according to the second embodiment of the invention. In the second embodiment of the invention, the flag region 110B of the memory array 110 further includes an RF flag. The RF flag is a flag that determine whether the forward conversion data of the input data is programmed to the selected word or the reverse conversion data of the input data is programmed to the selected word during the programming action.

Figure 13:
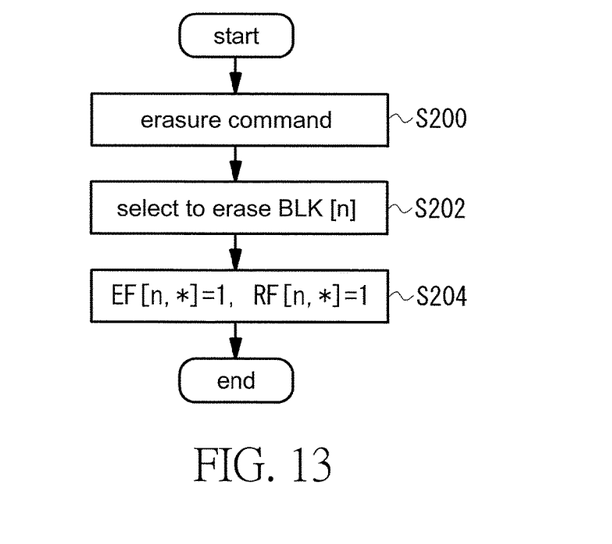
FIG. 13 is a flow chart of an erasure action of the resistance change memory according to the second embodiment of the invention.
Figure 16A:
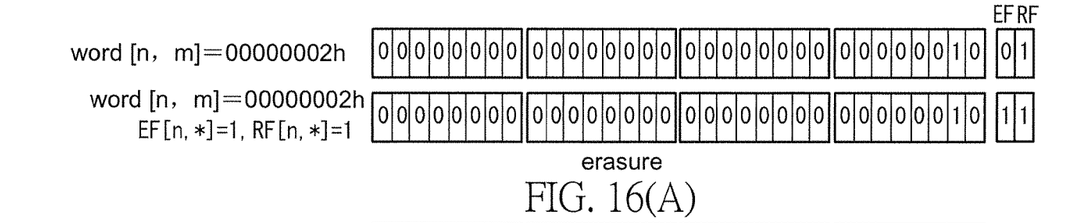
FIG. 16(A) to FIG. 16(C) are schematic views of concrete examples of the erasure action and the programming action of the resistance change memory according to the second embodiment of the invention.

FIG. 13 is a flow chart of an erasure action according to the second embodiment of the invention. In the second embodiment of the invention, the controller 120 respectively sets the EF flag [n, *] and the RF flag [n, m] of the selected block [n] as the data "1" (S204), and the other actions are identical to the actions provided in the first embodiment. FIG. 16(A) illustrates a concrete example. When the $m^{th}$ word [n, m] in the selected block [n] is "00000002h," the data is not modified; instead, the EF flag and the RF flag are set as "1," and the other words in the selected block [n] are set in the same manner.

Figure 14:
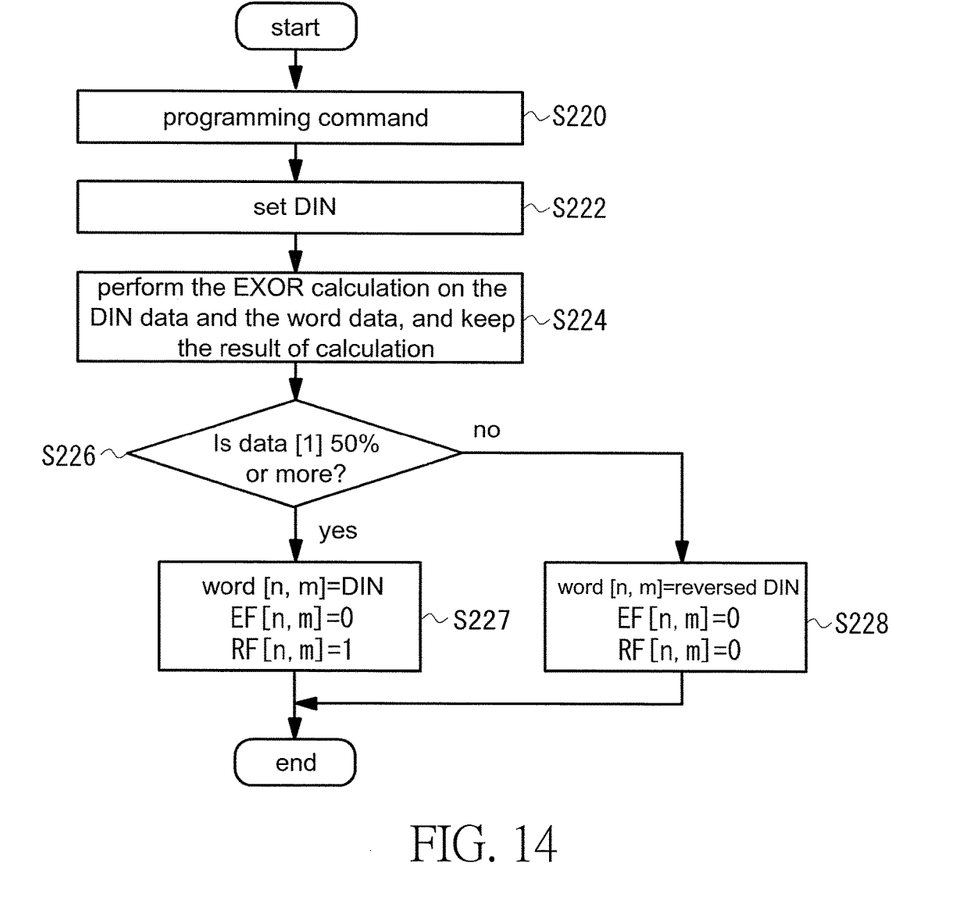
FIG. 14 is a flow chart of a programming action of the resistance change memory according to the second embodiment of the invention.

FIG. 14 is a flow chart of a programming action according to the second embodiment of the invention. The controller 120 receives the external programming command and the address (S220) and loads the external input data DIN to the data input part 50 (S222). Next, the controller 120 selects the word [n, m] in the selected block [n] from the memory array 110 according to the row address, executes the exclusive-OR (EXOR) calculation on the data stored in the selected word [n, m] and the input data DIN, and keeps the result of the EXOR calculation in a register, a variable switch, etc. (S224). The bits that are consistent with the input data DIN are changed to "0," and the bits that are inconsistent with the input data DIN are changed to "1". The controller 120 then counts the data "1" according to the result of the EXOR calculation and determines whether the number of data "1" is 50% or more (S226). The number of data "1" indicates the number of bits which is stored in the selected word and inconsistent with the number of bits in the input data DIN. If the number of counted data "1" is 50% or more than 50%, the input data DIN is programmed to the selected word [n, m], the EF flag is set as "0," and the RF flag is set as "1" (S227). Note that the selected word [n, m] is programmed by reversing the inconsistent bits. On the contrary, if the number of counted data "1" is less than 50%, the reverse conversion data of the input data DIN is programmed to the selected word [n, m], the EF flag is set as "0," and the RF flag is set as "0" (S228). In this case, only the inconsistent bits in the selected word [n, m] are reversed. The programming action then ends.

Figure 16B:
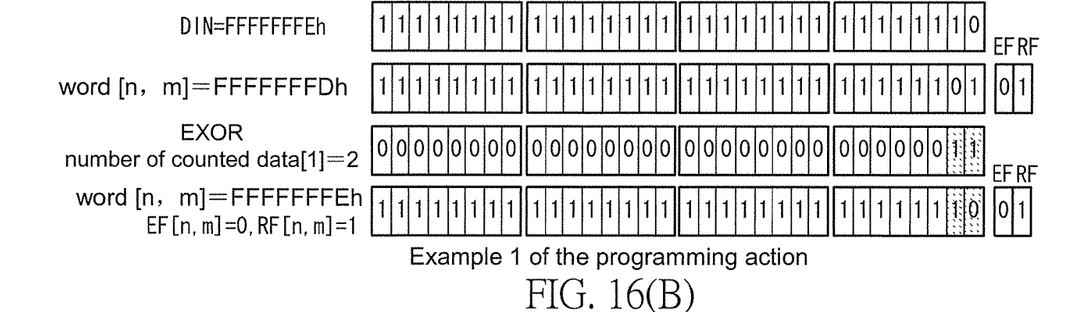

FIG. 16(B) and FIG. 16(C) illustrate concrete examples. In Example 1 of the programming action, as illustrated in FIG. 16(B), when the input data DIN is "FFFFFFFEh," and the data stored in the selected word [n, m] is "FFFFFFFDh," the number of counted data "1" in the result of the EXOR calculation is "2". In other words, the number of data "1" is less than 50%. Hence, the input data DIN is programmed to the selected word [n, m], but only the data of the selected word [n, m] which corresponds to "1" indicating inconsistency in the EXOR calculation and is of a low bit of 2 bits is reversed. Besides, the RF flag is set as "1" to indicate that the programming action is executed on the forward conversion data.

Figure 16C:
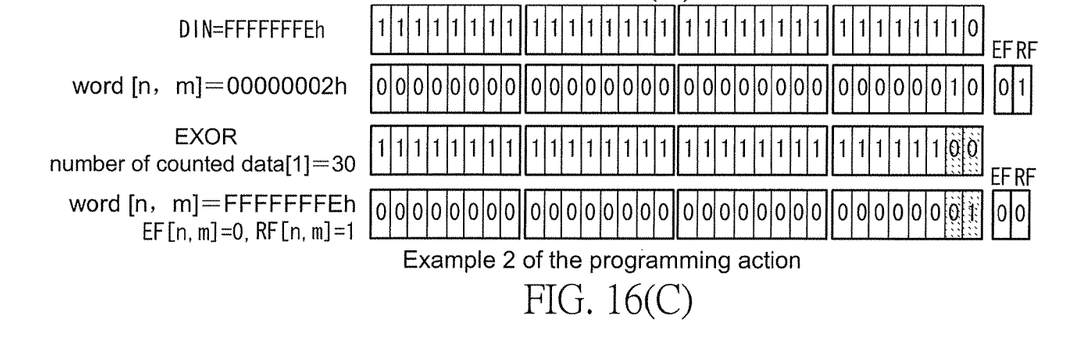

In Example 2 of the programming action, as illustrated in FIG. 16(C), if the input data DIN is "FFFFFFFEh," and the data stored in the selected word [n, m] is "00000002h," the number of counted data "1" in the result of the EXOR calculation is "30". Since the number of inconsistent data "1" is 50% or more, the reverse conversion data of the input data DIN is programmed to the selected word [n, m]. In this case, because the reverse conversion data is used, only the data of the bits of the selected word [n, m] which corresponds to "0" indicating consistency in the EXOR calculation is reversed. Besides, the RF flag is set as "0" to indicate that the reverse conversion data of the input data DIN is programmed.

Figure 15:
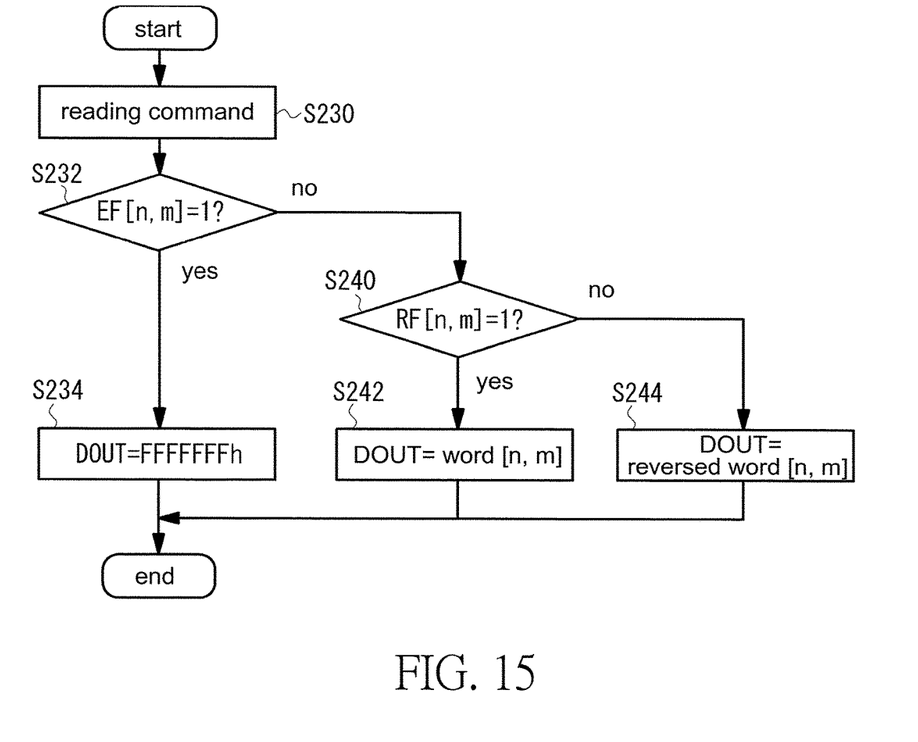
FIG. 15 is a flow chart of a reading action of the resistance change memory according to the second embodiment of the invention.

FIG. 15 is a flow chart of the reading action according to this embodiment. After receiving the external reading command and the address (S230), the controller 120 selects the $m^{th}$ word [n, m] in the selected block [n] according to the row address and determines whether the EF flag of the selected word [n, m] is "1" or not (S232). If the EF flag is "1," the controller 120 outputs all the reading data DOUT as "1", regardless of the data stored in the selected word [n, m] (S234). By contrast, if the EF flag is "0," the controller 120 determines whether the RF flag is "1" or not (S240). If the RF flag is "1," the controller 120 outputs the data stored in the selected word [n, m] as the reading data DOUT (S242).

If the RF flag is "0," the controller 120 outputs the data obtained by reversing the data stored in the selected word [n, m] as the reading data DOUT (S244).

Figure 17A:
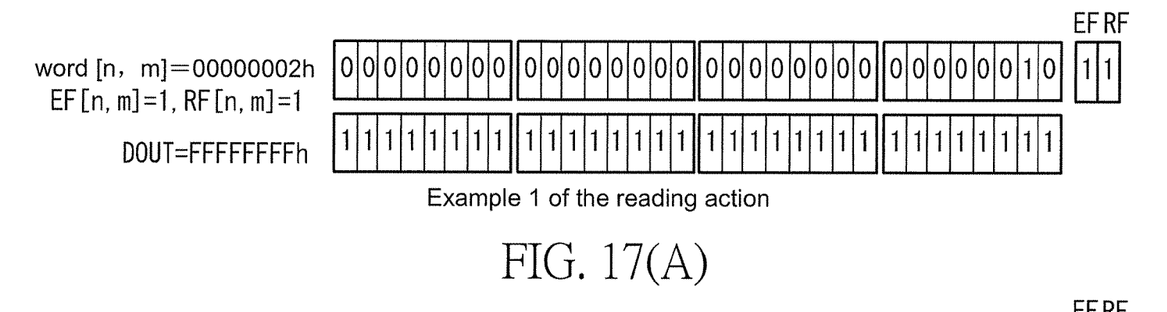
FIG. 17(A) to FIG. 17(C) are schematic views of concrete examples of the reading action of the resistance change memory according to the second embodiment of the invention.
Figure 17B:
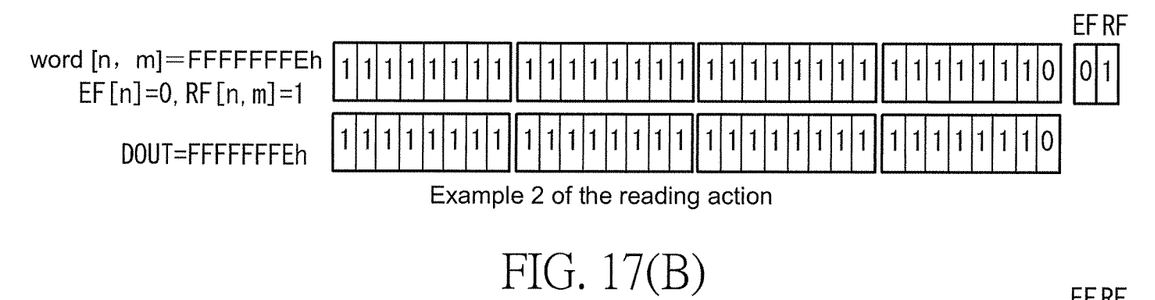
Figure 17C:
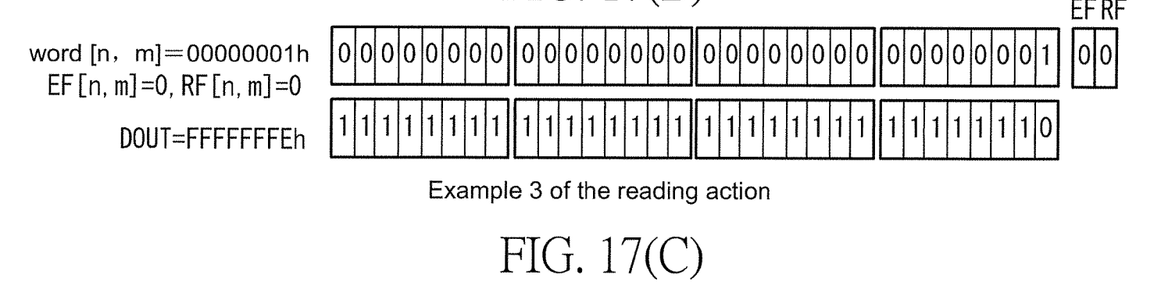

FIG. 17(A), FIG. 17(B) and FIG. 17(C) illustrate concrete examples. In Example 1 of the reading action, as illustrated in FIG. 17(A), the EF flag is "1," and thus "FFFFFFFFh" irrelevant to the data "00000002h" stored in the selected word [n, m] is output as the reading data DOUT. In Example 2 of the reading action, as illustrated in FIG. 17(B), the EF flag is "0," and the RF flag is "1," and thus the data "FFFFFFFE2h" stored in the selected word [n, m] is output as the reading data DOUT. In Example 3 of the reading action, as illustrated in FIG. 17(C), the EF flag is "0," and the RF flag is "0"; because the reverse conversion data of the input data DIN is already programmed to the selected word [n, m], the reverse conversion data of the data stored in the selected word [n, m] is output as the reading data DOUT.

According to the second embodiment of the invention, when the programming action is executed, the forward conversion data of the input data or the reverse conversion data of the input data is programmed based on the ratio of inconsistency or consistency between the input data and the data stored in the selected word, and thus the number of times of rewriting the variable resistance element can be less than that provided in the first embodiment.

Although the above embodiments illustrate examples of the resistance change memory executing the actions in a manner compatible with the NOR flash memory, the specification of the resistance change memory may be compatible with that of the NAND flash memory, and the resistance change memory may execute the actions in a manner compatible with the NAND flash memory. Moreover, the above embodiments exemplify the resistance change memory as a semiconductor memory device capable of random access, and the data of the non-volatile memory element can be directly rewritten from "0" to "1" or from "1" to "0"; however, the non-volatile memory element is not limited to the variable resistance memory element and may be another element storing data through a strong dielectric member, a magnet, etc.

Although the embodiments of the invention have been described above, the invention is not limited thereto. The configuration of the details may be modified where appropriate without departing from the scope of the spirit of the invention.

What is claimed is:

1. A semiconductor memory device, comprising:
   a memory array, configured to storing data by a reversible and nonvolatile variable resistance element;
   an erasure unit, wherein when erasing a selected block of the memory array in response to an external erasure command, the erasure unit configured to set a first flag data indicating whether the selected block is in an erasure state without changing the data in the selected block;
   a reading unit, wherein when reading a selected word of the memory array in response to an external reading command, the reading unit configured to output data of the selected word or data indicating the erasing based on the first flag data,
   wherein the erasure unit configured to set the first flag data, when the first flag data indicates the erasure state, the data indicating the erasing is output by the reading unit without relation of data stored in the selected word; and
   a programming unit, configured to receive an external programming command and programming input data to the selected word of the memory array, the programming unit setting the first flag data to be in a non-erasure state,
   wherein the programming unit configured to compare the data stored in the selected word with the input data, programs the input data or reverse conversion data of the input data to the selected word according to a comparing result, and sets a second flag data for determining data for programming,
   wherein the programming unit configured to reverse inconsistent data in the selected word according to the comparing result,
   a ratio of inconsistency is the relationship between the input data and the data stored in the selected word;
   if the ratio of inconsistency between the input data and the data stored in the selected word is 50% or more than 50%, the input data is programmed to the selected word, but only the data of the selected word corresponding to "1" indicating Inconsistency in an EXOR calculation is reversed;
   if the ratio of inconsistency is less than 50%, the reverse conversion data is programmed to the selected word, but only the data of the selected word corresponding to "0" indicating consistency in the EXOR calculation is reversed, and the second flag data indicates the input data or the reverse conversion data is already programmed.

2. The semiconductor memory device according to claim 1, wherein
   the erasure unit configured to set the first flag data, when the first flag data indicates the non-erasure state, the reading unit outputs the data stored in the selected word.

3. The semiconductor memory device according to claim 1, wherein
   the reading unit configured to output the data of the selected word or the reverse conversion data of the input data based on the second flag data.

4. The semiconductor memory device according to claim 1, wherein
   the memory array comprises a flag region configured to store the first flag data and a second flag data, the flag region is set correspondingly to each word of a memory cell.

5. The semiconductor memory device according to claim 1, further comprising a controller configured to execute the erasure command, a programming command, and the reading command are compatible commands with a flash memory;
   wherein the erasure command, a programming command, and the reading command can switch data from "0" to "1" or from "1" to "0".

6. A semiconductor memory device comprising a non-volatile memory element capable of random access and rewriting data of the memory element from "0" to "1" or from "1" to "0", the semiconductor memory device further comprising:
   an erasure unit, wherein when erasing a selected block of the memory element in response to an external erasure command, the erasure unit configured to set a first flag data indicating whether the selected block is in an erasure state without changing data in the selected block;
   a reading unit, wherein when reading a selected word of the memory element in response to an external reading command, the reading unit configured to output data stored in the selected word or data indicating the erasing based on the first flag data, wherein the erasure unit configured to set the first flag data, when the first flag data indicating the erasing is output by the reading unit without relation of data stored in the selected word; and a programming unit, configured to receive an external programming command and programming input data to the selected word of the memory array, the programming unit setting the first flag data to be in a non-erasure state, wherein the programming unit configured to compare the data stored in the selected word with the input data, programs the input data or reverse conversion data of the input data to the selected word according to a comparing result, and sets a second flag data for determining data for programming, wherein the programming unit configured to reverse inconsistent data in the selected word according to the comparing result, a ratio of inconsistency is the relationship between the input data and the data stored in the selected word;

if the ratio of inconsistency between the input data and the data stored in the selected word is 50% or more than 50%, the input data is programmed to the selected word, but only the data of the selected word corresponding to "1" indicating inconsistency in an EXOR calculation is reversed;

if the ratio of inconsistency is less than 50%, the reverse conversion data is programmed to the selected word, but only the data of the selected word corresponding to "0" indicating consistency in the EXOR calculation is reversed, and the second flag data indicates the input data or the reverse conversion data is already programmed.

* * * * *